United States Patent [19]

Forward et al.

[11] 4,180,786
[45] Dec. 25, 1979

[54] IMPEDANCE-MATCHING CIRCUIT USING NEGATIVE LOW-NOISE RESISTANCE

[75] Inventors: Robert L. Forward, Oxnard; Gary D. Thurmond, Calabasas, both of Calif.

[73] Assignee: Hughes Aircraft Company, Culver City, Calif.

[21] Appl. No.: 929,582

[22] Filed: Jul. 31, 1978

[51] Int. Cl.² ............................................. H03H 7/38
[52] U.S. Cl. ................................. 333/32; 307/DIG. 1; 330/149; 333/217
[58] Field of Search ................................ 333/32, 217; 307/DIG. 1; 330/149

[56] References Cited

U.S. PATENT DOCUMENTS

| | | | |
|---|---|---|---|
| 3,051,846 | 8/1962 | Schott | 333/217 X |
| 3,079,569 | 2/1963 | De Loach, Jr. | 333/217 X |
| 3,187,266 | 6/1965 | Marshall, Jr. | 333/217 X |

Primary Examiner—Paul L. Gensler
Attorney, Agent, or Firm—Paul M. Coble; W. H. MacAllister

[57] ABSTRACT

A circuit is disclosed for impedance matching an electrical signal-generating transducer to an electrical signal-processing amplifier while substantially retaining both the original signal-to-noise power ratio and the original signal amplitude at the input to the amplifier. A load resistance of a value substantially equal to twice the characteristic resistance of the transducer is coupled across the amplifier input, while a negative low-noise resistance approximately equal in magnitude to the source resistance is coupled in series with the load resistance. A transmission line having a characteristic impedance approximately equal to the transducer resistance is coupled between the transducer output and the series-coupled load resistance and negative resistance.

6 Claims, 6 Drawing Figures

IMPEDANCE-MATCHING CIRCUIT USING NEGATIVE LOW-NOISE RESISTANCE

BACKGROUND OF THE INVENTION INCLUDING PRIOR ART STATEMENT

This invention relates generally to electrical impedance-matching circuits, and more particularly, it relates to a circuit for impedance matching an electrical signal-generating transducer to electrical signal-processing circuitry with minimum degradation of both the electrical signal and the signal-to-noise ratio.

A number of modern signal-processing systems utilize devices generally termed transducers in the collection, transformation, amplification or transmission of signals of various forms (e.g., electrical, optical, inertial, mechanical). For example, photodetector sensors in electronic video cameras, missile seekers and laser communication systems collect optical signals and transform them into electrical signals; inertial sensors such as accelerometers, gyros and gravity gradiometers in navigation systems collect inertial signals and transform then into electrical signals; and repeater amplifiers in computers and electrical, microwave and laser communication systems function to amplify an electrical signal without changing its form. The foregoing transducer types have the general characteristics that they couple to a source of signals (e.g., electrical, optical, inertial, mechanical, gravitational) and produce a replica of that signal with more or less fidelity. sometimes maintaining the same form of the signal (e.g., electrical-to-electrical, mechanical-to-mechanical), but often transforming the signal from one form to another (e.g., light-to-electrical, gravitational-to-electrical).

The objective of a transducer is to carry out the desired transformation without degradation of the signal, either by lowering its level or by adding noise, thus maintaining the signal-to-noise power ratio (SNR) of the system. Each of the aforementioned transducers, being subject to various non-ideal constraints, must of necessity introduce some noise, which becomes mixed with the signal. Although noise may sometimes be multiplicative or of a complex nature, the noise is usually random and additive. (Additive random noise is assumed for purposes of the following discussion.)

Each transducer also has associated with it an impedance. This impedance may be complex, but usually it is purely resistive or can be made so with the addition of properly matched reactive impedances. Irrespective of the nature of the impedance, it is the resistive portion of the transducer impedance that is of most concern, since it is the source of additive noise. Thus, at the output terminals of an electrical signal-generating transducer, a voltage exists consisting of both the desired signal voltage and a noise voltage, the noise voltage being that introduced by the transducer resistance. An effective signal-to-noise power ratio $(SNR)_0$ for the transducer may be defined as the ratio of the signal power (voltage squared) to the noise power (voltage squared) at the transducer output terminals.

It is well known in the electronics art that if it is desired to process the transducer output voltage with minimum degradation of the signal-to-noise power ratio, one should use signal-processing circuitry (such as an amplifier) with an input load resistance that is as high as possible, along with a bandwidth that matches the bandwidth of the transducer output signal.

The signal-to-noise power ratio, although important, is not the only concern in wideband signal-processing systems. If there is a substantial distance between the transducer and the following signal-processing stage (e.g. amplifier), then these components must be connected by a transmission line. If the signal is of very high frequency and the transmission line is long, then the wavelength of the signal becomes comparable to the transmission line length. In such cases, if the impedance of the transmission line is not matched to that of either the transducer or the following stage, reflected and standing waves can exist in the transmission line which result in undesirable distortion of the signal. Therefore, it is usually desirable to select the impedance of the transmission line to match the impedance of the transducer, and also, to choose the input load resistance of the following stage to match the transmission line impedance.

When a transducer, transmission line and following signal-processing stage are impedance-matched as described above, two penalities are paid at the input to the following stage. First, the signal amplitude decreases by a factor of two from its original value, and second, the signal-to-noise power ratio suffers a degradation of 3 dB.

In a paper by W. S. Percival, "An Electronically 'Cold' Resistance", *The Wireless Engineer*, Vol. 16, (May 1939), pp. 237–240, it is pointed out that if a transmission line were terminated with a noiseless resistance, the signal-to-noise ratio is not altered. Thus, by terminating a transmission line with a properly matched low-noise resistance, the desired impedance matching may be achieved with minimum loss in the signal-to-noise ratio. Nevertheless, the signal applied to the stage following the transmission line is reduced to half of its original amplitude. As a result, additional amplification is required, adding to the cost and complexity of the system. In addition, if the following stage is not perfectly noise-free, then the signal-to-noise ratio is also degraded more than if the signal were maintained at its original amplitude.

SUMMARY OF THE INVENTION

It is an object of the present invention to provide a circuit for impedance matching electrical signal-processing circuitry to a source of electrical signals while at the same time substantially retaining both the original signal-to-noise power ratio and the original signal amplitude at the input to the electrical signal-processing circuitry.

In an impedance-matching circuit according to the invention, a load resistance of a value substantially equal to twice the characteristic resistance of the electrical signal source is coupled between the signal-processing circuitry input terminals. A negative low-noise resistance approximately equal in magnitude to the source resistance is coupled between an output terminal of the signal source and an input terminal of the signal-processing circuitry, with the other source output terminal coupled to the other processing circuitry input terminal. This circuit applies the entire signal voltage of the source between the input terminals of the processing circuitry while effectively short-circuiting the voltage noise of the load resistance.

Additional objects, advantages, and characteristic features of the invention will be readily apparent from the following detailed description of a preferred embodiment of the invention when considered in conjunction with the accompanying drawings.

DESCRIPTION OF A PREFERRED EMBODIMENT

For purposes of the ensuing discussion, a transducer can be represented as an ideal transducing component in series with a characteristic impedance $R_T$ which is assumed to be purely resistive. As is well known in the electronics art, resistors are a source of random noise called Johnson noise or Nyquist noise, due to their coupling with the thermodynamic environment. The resultant thermal noise voltage $V_T$ is given by $$V_T = \sqrt{4kTBR_T}, \qquad (1)$$

where k is Boltzmann's constant ($1.38 \times 10^{-23}$ joules per °K.), T is the temperature in °K. of the resistor and its thermal surroundings, B is the bandwidth in Hertz over which the noise is measured, and $R_T$ is the resistance in ohms of the resistor.

Figure 1:
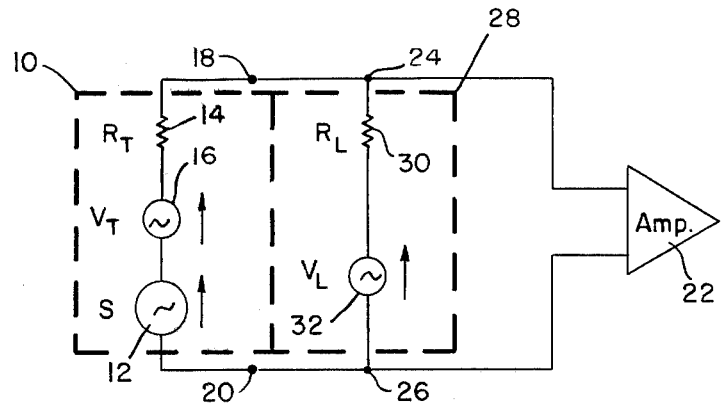
FIG. 1 is a schematic circuit diagram, including equivalent noise voltage sources, illustrating a prior art circuit having an amplifier with a high input impedance coupled to the output from a transducer in order to provide a maximum signal-to-noise ratio.

In FIG. 1 an equivalent circuit representation for the transducer under consideration is depicted within dashed lines 10. This representation includes the series combination of an ideal voltage source 12 which generates the desired signal voltage S, a resistor 14 of resistance $R_T$ representing the characteristic resistance of the transducer, and a noise voltage source 16 which generates a noise voltage $V_T$ due to the resistance $R_T$. An effective overall voltage $E_0$ thus appears between the transducer output terminals 18 and 20 given by $$E_0 = S + V_T. \qquad (2)$$

An effective signal-to-noise power ratio $(SNR)_0$ for the transducer 10 is defined as the ratio of the signal power (voltage squared) to the noise power (voltage squared) appearing between the transducer output terminals 18 and 20. Thus, $$(SNR)_0 = S^2/V_T^2. \qquad (3)$$

As was indicated above, transducer output voltages are normally applied to electrical signal-processing circuitry. In FIG. 1 such circuitry is illustrated as an amplifier 22 having its input terminals 24 and 26 connected to the respective transducer output terminals 18 and 20. An input electrical load depicted within dashed lines 28 is provided for the amplifier 22 and includes a load resistor 30 having a resistance $R_L$ coupled between amplifier input terminals 24 and 26. Since the circuit of FIG. 1 is designed to process the output voltage $E_0$ from the transducer 10 with minimum degradation of the signal-to-noise ratio $(SNR)_0$, the resistance $R_L$ should be as high as possible, and the bandwidth of the amplifier 22 should be selected to match that of the transducer output signals. Moreover, since the load resistor 30 generates Johnson noise, a noise voltage source 32 which generates a noise voltage $V_L$ is shown coupled in series with resistor 30. The noise voltage $V_L$ generated by the resistor 30 is given by $$V_L = \sqrt{4kTBR_L}. \qquad (4)$$

Using standard electrical analysis techniques for the circuit of FIG. 1, the current $I_s$ in the circuit due to the signal voltage S is $$I_S = S/(R_T + R_L), \qquad (5)$$

and the resultant signal voltage $E_S$ at the input to the amplifier 22 is $$E_S = \frac{R_L}{R_T + R_L} S. \qquad (6)$$

Similarly, the noise $E_T$ at the input to the amplifier 22 due to the noise generated by the transducer resistance $R_T$ is $$E_T = \frac{R_L}{R_T + R_L} V_T. \qquad (7)$$

Since the noise voltage $V_L$ of the load resistor 30 is already across input to the amplifier 22, the voltage drop across resistor 30 due to current induced by the voltage $V_L$ is partially cancelled, and the total noise voltage across the input to the amplifier 22 due to the load resistor 30 consists of two partially compensating voltages. To demonstrate this, standard electrical analysis techniques may be used to calculate the noise current $I_L$ introduced into the circuit with total resistance $R_T + R_L$ by the noise voltage $V_L$ as $$I_L = V_L/(R_T + R_L). \qquad (8)$$

The voltage $E_L$ across the input to the amplifier 22 due to the noise voltage $V_L$ is then $$E_L = V_L - I_L R_L \qquad (9)$$
$$= V_L - \frac{R_L V_L}{R_T + R_L} \qquad (10)$$
$$= \frac{R_T}{R_T + R_L} V_L. \qquad (11)$$

With two sources of uncorrelated noise, it is well known in the art that the cross-products of the two noise sources average out to zero so that $$(E_L + E_T)^2 = E_L^2 + \overline{2E_L E_T} + E_T^2 \tag{12}$$

$$= E_L^2 + E_T^2. \tag{13}$$

Using Equations (6), (7), (11) and (13), the signal-to-noise power ratio $(SNR)_H$ at the input to the high impedance amplifier 22 may be calculated as follows:

$$(SRN)_H = \frac{E_S^2}{E_T^2 + E_L^2} = \frac{R_L^2 S^2}{R_L^2 V_T^2 + R_T^2 V_L^2}. \tag{14}$$

Substituting Equations (1) and (4) in Equation (14) gives $$(SNR)_H = \frac{R_L^2 S^2}{4kTB(R_L^2 R_T + R_T^2 R_L)} \tag{15}$$

$$= \frac{R_L^2 S^2}{4kTBR_T(R_L^2 + R_T R_L)} \tag{16}$$

$$= \frac{R_L}{R_L + R_t} \frac{S^2}{V_T^2} \tag{17}$$

$$= \frac{R_L}{R_L + R_R} (SNR)_o. \tag{18}$$

Assuming that $R_L >> R_T$ (for example, $R_T = 10$ kilohms and $R_L = 10$ megohms), then $$R_L/(R_L + R_T) = 1/1.001. \tag{19}$$

Thus, it may be seen that the signal-to-noise power ratio at the input to a high impedance amplifier is almost the same as the original signal-to-noise power ratio, i.e., $$(SNR)_H = (SNR)_0/1.001. \tag{20}$$

Figure 2:
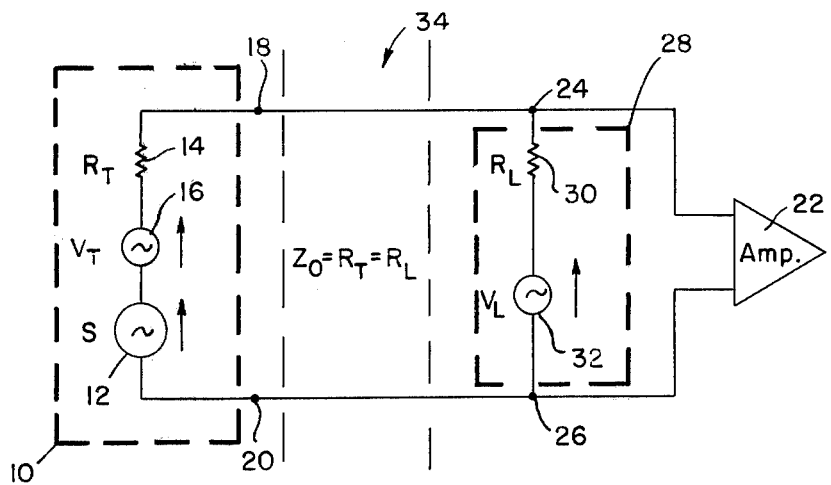
FIG. 2 is a schematic circuit diagram, including equivalent noise voltage sources, illustrating a prior art circuit having an amplifier coupled to the output from a transducer via an impedance-matching transmission line in order to minimize distortion.

As was indicated above, if there is a considerable distance between the transducer 10 and the amplifier 22, it is the practice to intercouple these components by means of a transmission line. Such a circuit is illustrated in FIG. 2. Components in the circuit of FIG. 2 which correspond to respective components in the circuit of FIG. 1 are designated by the same reference numerals as their corresponding components in FIG. 1. Moreover, in the circuit of FIG. 2 output terminals 18 and 20 of the transducer 10 are coupled to respective input terminals 24 and 26 of the amplifier 22 by a transmission line 34 having a characteristic impedance $Z_0$. In order to minimize distortion of the signal in the circuit of FIG. 2, the transmission line characteristic impedance $Z_0$ is selected to match the impedance of the transducer 10, and the input load resistance of the amplifier 22 is selected to match the transmission line impedance. In other words, in the circuit of FIG. 2

$$Z_0 = R_T = R_L. \tag{21}$$

By substituting Equation (21) in Equation (6), it may be seen that for the circuit of FIG. 2

$$E_S = \tfrac{1}{2} S. \tag{22}$$

Thus, the amplitude of the signal at the input to the matched amplifier 22 of FIG. 2 is decreased by a factor of two from its original value.

The signal-to-noise power ratio $(SNR)_M$ at the input to the amplifier 22 in the matched circuit of FIG. 2 may be calculated using Equation (14). However, since $R_T = R_L$, their noise voltages are the same, i.e., $V_T = V_L$. Thus, $$(SNR)_M = S^2/2V_T^2 = \tfrac{1}{2}(SNR)_0 \tag{23}$$

Accordingly, it may be seen that the signal-to-noise power ratio at the input to the amplifier 22 in the matched circuit of FIG. 2 is decreased by a factor of two from its original value, which corresponds to a degradation of 3 dB.

Figure 3:
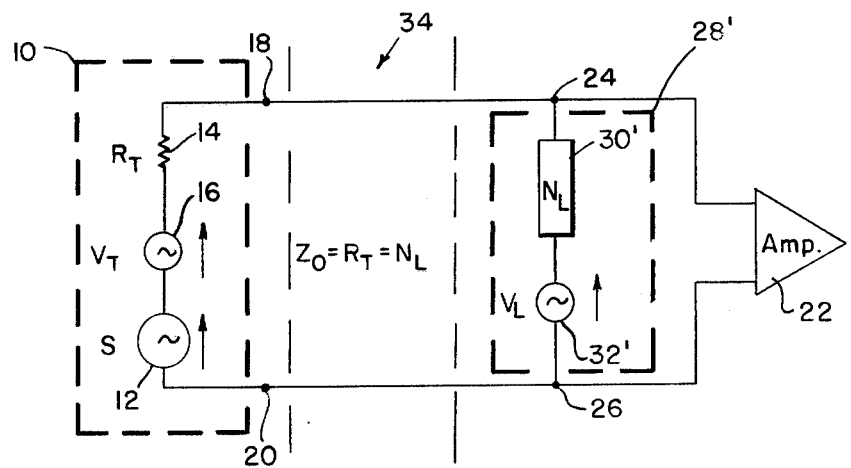
FIG. 3 is a schematic circuit diagram, including equivalent noise voltage sources, illustrating a prior art circuit having an amplifier with a low-noise input load resistance coupled to a transducer in order to achieve impedance matching with minimum loss in signal-to-noise ratio.

As was mentioned above, the aforementioned Percival paper points out that by terminating a transmission line with a properly matched low-noise resistance, desired impedance matching may be achieved with minimum loss in the signal-to-noise ratio. Such a circuit is illustrated in FIG. 3. Components in the circuit of FIG. 3 which correspond to respective components in the circuits of FIGS. 1 or 2, or both, are designated by the same reference numerals as their corresponding components in FIGS. 1 and 2.

In the circuit of FIG. 3 a low-noise load 28' is coupled between amplifier input terminals 24 and 26 instead of the conventional resistive load 28 in the circuit of FIG. 2. Low-noise load 28' comprises a low-noise resistor 30' providing a resistance of $N_L$. Since, in practice, low-noise resistor 28' will generate a small amount of noise, noise source 32' is shown coupled in series with low-noise resistor 28' in FIG. 3. For purposes of illustration, it is assumed that the noise voltage $V_L$ generated by the source 32' is 0.1 of that generated by a conventional resistor having a comparable resistance value. In other words, $$V_L = 0.1\sqrt{4kTBN_L}. \tag{24}$$

In the circuit of FIG. 3 the resistance $N_L$ matches the impedance of the transducer 10 as well as the characteristics transmission line impedance, i.e.

$$Z_0 = R_T = N_L. \tag{25}$$

By substituting Equation (25) in Equation (6) with $N_L = R_L$, it may be seen that for the circuit of FIG. 3

$$E_s = \tfrac{1}{2} S. \tag{26}$$

The signal-to-noise power ratio $(SNR)_N$ at the input to the amplifier 22 in the circuit of FIG. 3 may be calculated by substituting Equations (1) and (24) in Equation (14) with $R_L = N_L = R_T$ to give $$(SNR)_N = S^2/4kTBR_T(1.01). \tag{27}$$

Using Equations (1) and (3), Equation (27) reduces to $$(SNR)_N = \frac{S^2}{1.01 V_T^2} = \frac{(SNR)_o}{1.01}. \tag{28}$$

It may be seen from Equation (28) that the circuit of FIG. 3 provides the desired impedance matching with very little loss in the signal-to-noise power ratio. However, as shown by Equation (26), the amplitude of signal at the input to the matched amplifier 22 of FIG. 3 is decreased by a factor of two from its original value. Thus, with regard to signal amplitude, the circuit of FIG. 3 offers no improvement over the circuit of FIG. 2.

Figure 4:
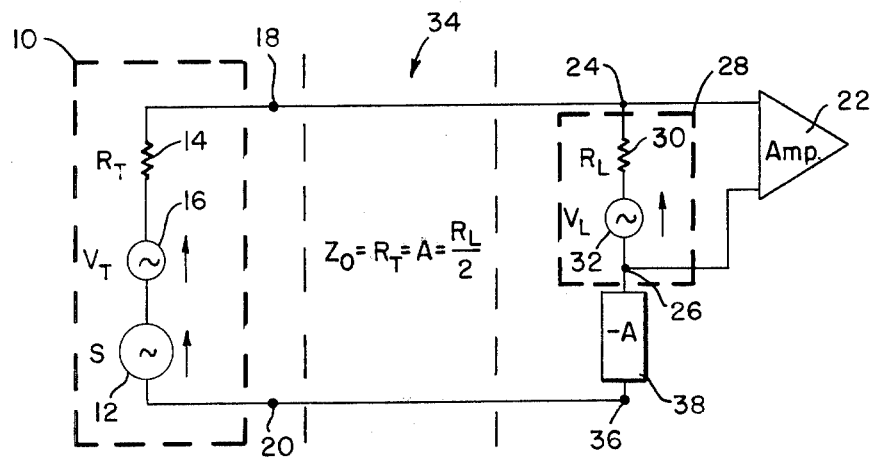
FIG. 4 is a schematic circuit diagram, including equivalent noise voltage sources, illustrating a circuit according to the invention for coupling an amplifier to the output from a transducer to achieve desired impedance matching without any significant reduction in either signal amplitude or signal-to-noise ratio.

In a circuit according to present invention, illustrated in FIG. 4, the desired impedance matching is achieved and, at the same time, both the original signal-to-noise power ratio and the original signal amplitude are substantially retained at the input to the following electrical signal-processing circuitry. Components in the circuit of FIG. 4 which corresponds to respective components in the circuits of the previous figures are designated by the same reference numerals as their corresponding components in the previous figures.

In the circuit of FIG. 4, the load resistor 30 coupled between the input terminals 24 and 26 of the amplifier 22 is selected to provide a resistance $R_L$ of a value equal to twice the transducer resistance $R_T$ and twice the transmission line characteristic impedance $Z_0$. Expressed mathematically $$R_L = 2R_T = 2Z_0. \tag{29}$$

Moreover, in the circuit of FIG. 4, coupled in series with the load resistor 30 between amplifier input terminal 26 and a further terminal 36 at the output end of the transmission line 34 (and coupled to the transducer output terminal 20 via the transmission line 34) is a negative "absorbor" 38. Negative absorbor 38 provides a negative low-noise resistance of a magnitude A equal to the magnitude of the transducer resistance $R_T$ and also equal to the magnitude of the transmission line characteristic impedance $Z_0$. Expressed mathematically $$A = R_T = Z_0. \tag{30}$$

A low-noise resistance is defined as a resistance having an associated noise voltage not exceeding approximately 50% of the noise voltage associated with a conventional resistor having the same resistance value. An "absorbor" is defined as a device that uses a power source and a sensing means to create an out-of-phase copy of an incoming signal which, when combined with the incoming signal, cancels the energy content of the incoming signal. An absorbor emits noise voltages only to the extent that it is not perfect (a perfect absorbor emits no noise). A negative absorbor, which is alternatively referred to as a "desorbor", is defined as a device that uses a power source and a sensing means to create an in-phase copy of an incoming signal, which when combined with the incoming signal, increases the energy content of the incoming signal. A desorbor also emits noise voltages only to the extent that it is not perfect.

Absorbors and desorbors are described in depth in my co-pending patent applications, Ser. No. 838,511, filed Oct. 3, 1977 now U.S. Pat. No. 4,156,859, and Ser. No. 881,296, filed Feb. 27, 1978. Examples of specific circuits which may be employed for the negative absorbor 38 are the desorbor circuit of FIG. 2 of my aforesaid application Ser. No. 881,296 and the desorbor circuits of FIGS. 4 and 6 of my aforesaid application Ser. No. 838,511. For purposes of discussion, it is assumed that the negative absorbor 38 generates a small noise voltage $V_A$ comparable to that of the noise source 32' of the low-noise load 28' of FIG. 3, i.e.

$$V_A = 0.1\sqrt{4kTBA}. \tag{31}$$

In the circuit of FIG. 4 the impedance $Z_L$ between the output terminals 24 and 36 of the transmission line 34 is given by $$Z_L = R_L - A. \tag{32}$$

Substituting Equations (29) and (30) in Equation (32) gives $$Z_L = 2Z_0 - Z_0 = Z_0. \tag{33}$$

Thus, the impedance "seen" by the transmission line 34 is equal to the transmission line characteristic impedance and, therefore, the transmission line is properly terminated with a matched load.

The current $I_S$ flowing between terminals 24 and 36 in the circuit of FIG. 4 due to the signal voltage S is $$I_S = \frac{S}{R_T + R_L - A}. \tag{34}$$

The resultant signal voltage $E_S$ across the load resistor 30 between amplifier input terminals 24 and 26 is $$E_S = \frac{R_L S}{R_T + R_L - A}. \tag{35}$$

Using Equations (29) and (30), Equation (35) becomes $$E_S = \frac{2R_T S}{R_T + 2R_T - R_T} = \frac{2R_T S}{2R_T} = S. \tag{36}$$

Thus, the signal voltage $E_S$ at the input to the matched amplifier 22 in the circuit of FIG. 4 may be seen to be undiminished in amplitude from the original signal voltage S.

In the circuit of FIG. 4 there are three sources of noise to consider, namely, the transducer resistor 14, the load resistor 30 and the negative absorbor 38. The noise voltage $E_T$ which appears between the amplifier input terminals 24 and 26 due to the transducer resistor 14 may be determined in a manner similar to the signal voltage $E_S$, i.e.

$$E_I = \frac{R_L V_T}{R_T + R_L - A} = V_T. \tag{37}$$

Thus, all of the noise voltage $V_T$ of the transducer 10 appears at the input to the amplifier 22.

Similarly, the noise voltage $E_A$ which appears between the amplifier input terminals 24 and 26 due to the negative absorbor 38 is $$E_A = \frac{R_L V_A}{R_T + R_L - A} = V_A, \tag{38}$$

and all of the negative absorbor noise voltage $V_A$ also appears at the input to the amplifier 22.

However, the noise of load resistor 30 in the circuit of FIG. 4 behaves in a remarkable fashion, for it does not show up at all. The voltage $V_L$ of the load resistor noise source 32 is exactly cancelled by the voltage appearing across the load resistor 30 due to the noise current $I_L$ from the noise source 32. As before, as the noise current $I_L$ is calculated as $$I_L = \frac{V_L}{R_T + R_L - A}, \qquad (39)$$

and the noise voltage $E_L$ between the amplifier input terminals 24 and 26 is $$E_L = V_L - I_L R_L \qquad (40)$$

$$= V_L - \frac{R_L V_L}{R_T + R_L - A} \qquad (41)$$

$$= \frac{(R_T - A)V_L}{R_T + R_L - A} = 0. \qquad (42)$$

Using Equations (29) and (30), Equation (42) becomes $$E_L = \frac{(R_T - R_T)V_L}{R_T + 2R_T - R_T} = 0. \qquad (43)$$

The aforescribed noise voltage cancellation occurs because the impedance $Z_R$ presented by the series combination of resistor 14 and negative absorbor 38 between the terminals 24 and 26 is $$Z_R = R_T - A = 0, \qquad (44)$$

and an effective short circuit appears between the terminals 24 and 26. However, it must be emphasized that this effective short circuit is present only with respect to the response of the circuit to noise. The signal voltage source 12 (which is assumed to be a signal generator of very low impedance) is still connected between the terminals 24 and 26, and hence the signal voltage S is not shorted out.

Figure 5:
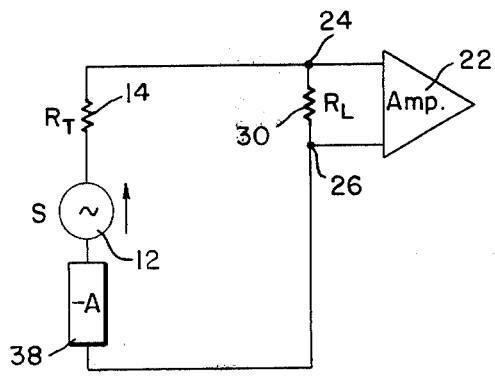
FIGS. 5 and 6 are respective equivalent circuit diagrams for the circuit of FIG. 4 used in explaining the operation of the circuit of FIG. 4.
Figure 6:
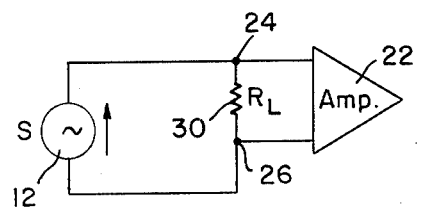

The foregoing may be better understood by redrawing the circuit of FIG. 4 without the noise sources and the transmission line as shown in FIG. 5. Further, since $A = R_T$, the circuit of FIG. 5 may be redrawn as shown in FIG. 6. Thus, it may be seen that the entire signal voltage S is applied across the input to the amplifier 22, while the very low impedance of the signal voltage source 12 is effectively short-circuiting the amplifier input, thus short-circuiting the voltage noise of the input load resistor 30.

The signal-to-noise power ratio $(SNR)_A$ at the input to the amplifier 22 in the circuit of FIG. 4 may be calculated as follows:

$$(SNR)_A = \frac{E_S^2}{E_T^2 + E_L^2 + E_A^2} \qquad (45)$$

$$= \frac{S^2}{V_T^2 + 0 + V_A^2}. \qquad (46)$$

Using Equations (30) and (1), Equation (31) may be rewritten as $$V_A^2 = 0.01(4kTBR_T) = 0.01 V_T^2. \qquad (47)$$

Substituting Equation (47) in Equation (46) gives $$(SNR)_A = \frac{S^2}{V_T^2 + 0.01 V_T^2} = \frac{S^2}{1.01 V_T^2} \qquad (48)$$

$$= \frac{(SNR)_o}{1.01} \qquad (49)$$

Thus, it may be seen that the circuit of FIG. 4 not only provides a matched load to the transducer 10 and the transmission line 34, and does this with minimum degradation of the signal-to-noise power ratio, but it also transmis the transducer output signal to the input to the amplifier 22 undiminished in amplitude.

The improved performance of the circuit of the invention over the prior art has been demonstrated by constructing a simulated signal source transducer and measuring the minimum detectable generated signal and the ratio of the detected-to-generated signal amplitude at the input to a following amplifier under four different load conditions simulating the respective circuits of FIGS. 1, 2, 3 and 4. For purposes of this discussion, the minimum detectable generated signal is defined as the level of generated signal needed to make the detected signal equal to the detected noise.

The simulated signal source consisted of a commercial sine wave generator driving a commercial 600 ohm impedance step attenuator in series with a 225,000 ohm resistor (thereby simulating a transducer with an internal resistance of 225,600 ohms). The amount of generated signal could be increased in calibrated 1 dB steps. This simulated transducer had an internal Johnson noise voltage due to its internal resistor. The Johnson noise voltage emitted by a 225,600 ohm resistor at room temperature (290° K.) in a 75 Hz bandwidth was calculated from Equation (1) to be 520 nV.

Measurements of the noise and signal from the aforedescribed simulated transducer were first carried out using a substantially open circuit configuration to simulate the circuit of FIG. 1. This was done by coupling the simulated transducer output across the input of a low-noise amplifier (Princeton Applied Research Model 110) having an input impedance of 100 megohms (which provides a substantially open circuit compared to the transducer impedance of 225,600 ohms). With no generated signal, the output voltage from the simulated transducer consisted solely of the internal noise of the transducer. This noise was detected by the low-noise amplifier and analyzed by a standard spectrum analyzer (Quan-Tech 304 TDL) having a filter bandwidth of 75 Hz. The total noise voltage measured was 530 nV, which agrees well with the prediction of 520 nV for the Johnson noise voltage of the transducer resistance, since the measured 530 nV value includes some noise from the low-noise amplifier.

The sine wave generator was then turned on, and essentially all of the generated signal appeared across the input to the low-noise amplifier. Thus, for the simulated circuit of FIG. 1, the minimum detectable generated signal was 530 nV, and the ratio of the detected-to-generated signal amplitude was unity.

The matched circuit of FIG. 2 was then simulated by connecting a 225,000 ohm resistor across the low-noise amplifier input terminals. With no generated signal, the noise voltage measured was 380 nV, which is approximately 0.707 of the noise voltage measured for the FIG. 1 simulation. When the sine wave generator was activated, only one-half of the generated signal appeared across the input to the low-noise amplifier (a decrease by a factor of two from the FIG. 1 simulation). Moreover, for the FIG. 2 simulation, the minimum detectable generated signal was 2×380 nV=760 nV (a reduction by a factor of 1.43 or 3.1 dB worse than for the FIG. 1 simulation).

Next, the circuit of FIG. 3 was simulated using an absorbor constructed according to the circuit of FIG. 1 of my aforesaid application Ser. No. 881,296 as the low-noise resistor 30'. The absorbor had a resistance of 225,000 ohms so as to provide a matched load across the input terminals of the low-noise amplifier. With no generated signal, the noise voltage was measured to be 275 nV. This noise voltage was only slightly more than one-half of the Johnson noise voltage of the transducer resistance, the slight excess noise being one-half of the noise of the absorbor and the excess noise of the low-noise amplifier.

When the sine wave generator was activated, only one-half of the generated signal appeared across the input terminals of the low-noise amplifier (a decrease by a factor of two from the FIG. 1 simulation). Moreover, for the simulated circuit of FIG. 3, the minimum detectable generated signal was 2×275 nV=550 nV (a reduction by a factor of only 1.04 or 0.3 dB worse than for the FIG. 1 simulation).

Finally, the circuit of FIG. 4 was simulated using the desorbor circuit of FIG. 2 of my aforesaid application Ser. No. 881,296 for the negative absorbor 38. The negative absorbor provided a resistance of −225,000 ohms and was connected in series with a 450,000 ohm resistor which, in turn, was connected between the input terminals of the low-noise amplifier. In this circuit configuration, with no generated signal, the measured noise voltage was 540 nV. When the sine wave generator was activated, the measured signal across the input to the low-noise amplifier was essentially the same as the generated signal. Thus, for the simulated circuit of FIG. 4, the ratio of the detected-to-generated signal amplitude was the same as for the FIG. 1 simulation and the minimum detectable generated signal was reduced by a factor of only 1.02 or 0.2 dB worse than for the FIG. 1 sumulation.

Accordingly, it may be seen that a circuit according to the invention is able to provide a matched load to a source of electrical signals while at the same time substantially retaining both the original signal-to-noise power ratio and the original signal amplitude at the input to the matched electrical signal processing circuitry.

Although the present invention has been shown and described with respect to a particular embodiment, nevertheless, various changes and modifications which are obvious to a person skilled in the art to which the invention pertains are deemed to lie within the spirit, scope and contemplation of the invention.

What is claimed is:

1. A circuit for impedance matching electrical signal-processing circuitry having first and second input terminals to a source of electrical signals having first and second output terminals and a given characteristic source resistance comprising:
    means coupled between said first and second input terminals for providing a load resistance approximately equal to twice said source resistance;
    means coupled between said second input terminal and said second output terminal for providing a negative low-noise resistance approximately equal in magnitude to said source resistance; and
    means for intercoupling said first output terminal and said first input terminal.

2. A circuit for impedance matching electrical signal-processing circuitry having first and second input terminals to a source of electrical signals having first and second output terminals and a given characteristic source resistance comprising:
    means coupled between said first and second input terminals for providing a load resistance approximately equal to twice said source resistance;
    means coupled between said second input terminal and a further terminal for providing a negative low-noise resistance approximately equal in magnitude to said source resistance; and
    means for intercoupling said first output terminal with said first input terminal and said second output terminal with said further terminal.

3. A circuit according to claim 2 wherein the last-named means includes a transmission line having a characteristic impedance approximately equal to said source resistance.

4. A circuit according to any of claim 1, 2 or 3 wherein said means for providing said negative low-noise resistance includes a desorbor.

5. A circuit according to any of claims 1, 2 or 3 wherein said source of electrical signals includes a transducer providing an electrical output signal between said first and second output terminals.

6. A circuit according to any of claims 1, 2 or 3 wherein said electrical signal-processing circuitry includes an amplifier having said first and second input terminals.

* * * * *